United States Patent [19]
Numata et al.

[11] 4,383,136
[45] May 10, 1983

[54] MUTING CIRCUIT FOR AM STEREOPHONIC RECEIVER

[75] Inventors: Tatsuo Numata; Akira Nishioka; Hitoshi Hirata, all of Tokyo, Japan

[73] Assignee: Pioneer Electronic Corporation, Tokyo, Japan

[21] Appl. No.: 274,564

[22] Filed: Jun. 17, 1981

[30] Foreign Application Priority Data

Jun. 19, 1980 [JP] Japan .................................. 55-83153
Jun. 19, 1980 [JP] Japan .................................. 55-83155

[51] Int. Cl.³ ............................................ H04H 5/00
[52] U.S. Cl. ................................................. 179/1 GS
[58] Field of Search ......................... 179/1 GS, 1 GB

[56] References Cited

FOREIGN PATENT DOCUMENTS 56-48739 5/1981 Japan ................................ 179/1 GS
56-51140 5/1981 Japan ................................ 179/1 GS

*Primary Examiner*—R. J. Hickey
*Attorney, Agent, or Firm*—Sughrue, Mion, Zinn, Macpeak & Seas

[57] ABSTRACT

A muting circuit for an AM stereophonic receiver of the type in which a received signal is phase modulated with a sub signal and amplitude modulated with a main signal and in which noise generated under certain adverse conditions is eliminated. A first detection signal is generated when the level of a received AM stereophonic signal is lower than a predetermined value, a second detection signal is generated upon detection of a non-locked state of a phase-locked loop circuit used to detect the sub signal, a third detection signal is generated when a frequency deviation detection senses is that a free-running frequency of a voltage controlled oscillator in the phase-locked loop circuit and a frequency of the AM stereophonic signal are different in frequency by more than a predetermined value; and a fourth detection signal is generated when a stereo pilot signal is absent. A muting circuit is activated in response to any of first through fourth detection signals. The frequency deviation detector is preferably implemented as a window detector which has an input-output characteristic including hysteresis.

8 Claims, 5 Drawing Figures

MUTING CIRCUIT FOR AM STEREOPHONIC RECEIVER

BACKGROUND OF THE INVENTION

The present invention relates to a muting circuit for an AM stereophonic receiver. More particularly, the invention relates to a muting device for a radio receiver for receiving AM stereophonic broadcast signals of the AM-PM type.

In the AM-PM type AM stereophonic system, a carrier in phase modulated with a sub signal, which is a difference signal between a right channel signal, and a left channel signal and thereafter amplitude modulated by a main signal, which is a sum signal of the right and left channel signals.

In an AM-PM type AM stereophonic receiver, the main signal is detected by an envelope AM detector for extracting the amplitude variation components of the carrier signal. Simultaneously, the amplitude variation components of the carrier signal are removed by a limiter, the output of which is detected by a PM detector to obtain the sub signal. The detected main and sub signals are fed to a matrix circuit where they are combined to obtain right and left channel signals.

There has been known a phase detection system which employs a phase-locked loop (PLL) circuit as a PM detector for the sub signal. In such a phase detection system, frequently noise is generated on a sub signal detection output line which accordingly produces an unpleasant sound in the output if the input signal level drops below a predetermined value, if the PPL circuit is in a non-locked state, if the free-running frequency of the VCO (voltage controlled oscillator) in the PLL circuit and the input signal frequency are different by more than a predetermined value when the PLL circuit is locked, or further if the AM stereophonic signal does not contain a stereo pilot signal but is broadcast monaurally.

The window comparator circuit is used to detect whether a certain input signal level falls within a predetermined level range or not. A window comparator circuit used in the muting circuit of the invention advantageously has an input vs. output characteristic exhibiting hysteresis. In this window comparator circuit, it is required that the (window) level range not vary with respect of the central potential thereof against the power supply voltage variations. It is a further requirement that the hysteresis width be arbitrarily and accurately settable.

SUMMARY OF THE INVENTION

A primary object of the invention is thus to provide a muting circuit for an AM sterephonic receiver which eliminates the unpleasant sound generated in the above-described cases and which provides substantially perfect outputs over a wide range of operating conditions.

It is a further object of the present invention to provide a window comparator which incorporates a hysteresis characteristic capable of satisfying all the above-described requirements with a simple configuration.

In the muting circuit for the AM-PM type AM stereophonic receiver constructed according to the invention a first detection signal is generated when the AM stereophonic signal level is lower than a predetermined value, a second detection signal is generated when the PLL circuit is in a non-locked state, a third detection signal is generated when the free-running frequency of the VCO of the PLL circuit and the AM stereophonic signal frequency are different by more than a predetermined value, a fourth detection signal is generated when the AM stereophonic signal does not contain a stereo pilot signal. The detected output of the receiving circuit is muted in response to at least one of the first to fourth detection signals.

Further in accordance with the above and other objects, there is provided, according to one aspect of the invention, a window comparator which includes two current switching circuits coupled in a differential amplifier configuration for generating a predetermined voltage difference around a reference voltage and driving the potential difference into first and second voltages which are substantially equal in higher and lower levels around the reference voltage as a center to advantageously apply the first and second voltages to the control electrodes of a pair of differential transistors for switching a predetermined current from a current source to the one of the pair of the transistors as a comparison reference and also to apply common input signal to the other control electrodes of the pair of the transistors for switching the predetermined current from the current source to the one of the pair of the transistors in response to the level of the common input signal. Thereby, the first and second voltages are varied substantially in equal amounts in response to the levels of the commonly-connected outputs of the first and second current switching circuits to thus obtain the comparison signal.

DESCRIPTION OF THE PREFERRED EMBODIMENTS

A preferred embodiment of a muting circuit for an AM stereophonic receiver constructed according to the invention will be described with reference to the drawings.

Figure 1:
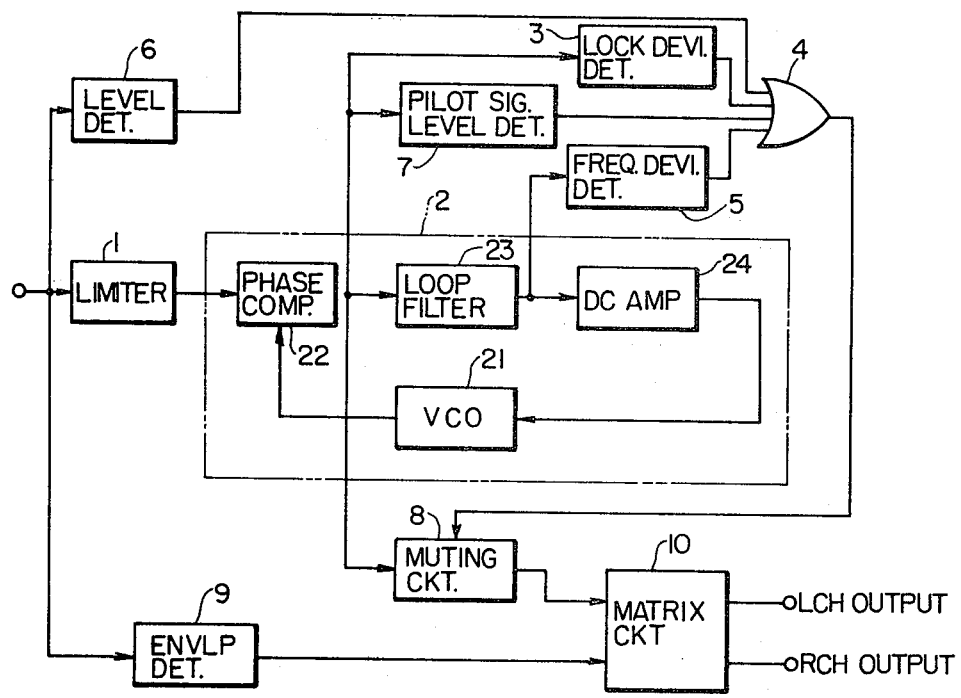
FIG. 1 is a block diagram of a preferred embodiment of a muting circuit for an AM stereophonic receiver constructed according to the invention.

FIG. 1 shows a block diagram of a preferred embodiment of a muting circuit constructed according to the invention. The phase modulated and amplitude modulated AM stereophonic signal input applied to an input terminal is limited in amplitude by a limiter 1, and the amplitude variation components are removed. The AM stereophonic signal thus processed is then applied from the limiter 1 to a phase detector which includes a phase-locked loop circuit (PLL) as designated by reference numeral 2. The PLL circuit 2 itself is a conventional type. The output of the limiter 1 is applied to a 90° phase comparator 22 in the PLL circuit 2. The phase comparator 22 compares the output from the limiter 1 in frequency and phase with an oscillator output signal from a voltage controlled oscillator (VCO) 21. The comparison output from the phase comparator 22 is applied through a loop filter 23 and a DC amplifier 24 sequentially to the VCO 21 to control the frequency and the phase of the oscillator output signal from the VCO 21.

The AM-PM stereophonic signal $e_C$ is represented by the following formula:

$$e_C = \{1 + \kappa_1(L+R)\} \cos\{\omega_C t + \kappa_2(L-R) + A \cos Pt\}, \quad (1)$$

where L and R represents left and right channel signal, $\kappa_2$ is the AM modulation factor, $\omega_C$ is the angular frequency of the carrier, P is the angular frequency ($2\pi \times 5$) of the pilot signal, and A is the amplitude of the pilot signal. Accordingly, the output $e'_C$ of the limiter 1 is:

$$e'_C = \cos\{\omega_C t + \kappa_2(L-R) + A \cos Pt\}. \quad (2)$$

Assuming that the oscillator output signal from the VCO 21 is $\sin \omega_C t$, the phase comparator 22 produces as an output a signal responsive to the phase difference between the output from the limiter 1 and the oscillator output signal from the VCO 21 with respect to the 90° phase difference of the output from the limiter 1 and the oscillator output signal from the VCO 21, that is, a signal represented by $\kappa_2(L-R) + A \cos Pt$. As this output from the phase comparator 22 represents the sub signal, the phase comparator 22 serves to produce a sub signal detection output.

When the level of the output and accordingly the sub signal of the comparator 22 is detected, the locked or non-locked state of the PPL circuit can be determined. The output from the phase comparator 22 is accordingly applied to a lock deviation detector 3, which serves to generate a non-lock detection signal when the sub signal output from the comparator 22 is very low or is not present in the output from the comparator 22. The output from the lock deviation detector 3 is applied to one input terminal of a muting control circuit 4. The output from the loop filter 23 in the PPL circuit, which is a DC component responsive to the phase difference between the output from the limiter 1 and the oscillator output signal from the VCO 21, is applied to a frequency deviation detector 5 which detects the DC component responsive to the phase difference between the output from the limiter 1 and accordingly the AM stereophonic signal and the oscillator output signal from the VCO 21 to thereby detect the deviation $\Delta f$ between the output frequency of the limiter 1 and the free-running oscillation frequency of the VCO 21. The output from the frequency deviation detector 5 is in turn applied to another input terminal of the muting control circuit 4.

Figure 2:
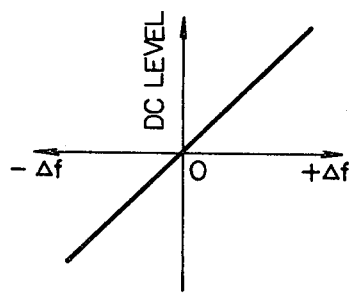
FIG. 2 is a graph showing the detuning frequency characteristics of a loop filter in the muting circuit of the invention.

FIG. 2 shows a curve representing the relationship between the output DC level of the filter 23 and the frequency deviation $\Delta f$ from the detector 5. This curve representing the relationship therebetween shows the existence of a proportional relation by a rectilinear line. Accordingly, it can be determined whether the PLL circuit is locked or not within a predetermined frequency range according to whether the DC level from the filter 23 falls within a predetermined level range or not. Thus, the frequency deviation detector 5 is constructed as a so-called window comparator.

The AM stereophonic signal input applied to the input terminal is also applied to a level detector 6 which detects the input signal level and in response thereto generates a detection signal when the input signal level falls below the predetermined valve. The detection signal output from the level detector 6 is applied to yet another input terminal of the muting control circuit 4. Further, the output from the phase comparator 22 is also applied to a pilot signal level detector 7 which detects the stereo pilot signal A cos Pt contained in the phase difference signal from the phase comparator 22 and generates a detection signal when the AM stereophonic signal from the limiter 1 does not contain the stereo pilot signal. The output from the pilot signal level detector 7 is also applied to still another input terminal of the muting control circuit 4. The muting control circuit 4 thus receives the four detection signals and in response thereto generates an on-off control signal for controlling a muting circuit 8. The muting control circuit is thus constructed fundamentally as an OR gate.

Further, the AM stereophonic signal applied to the input terminal is also applied to an envelope detector 9 which serves to detect the main signal. The detected output signal from the envelope detector 9 is applied to a matrix circuit 10 together with the sub signal detection signal from the muting circuit 8. The matrix circuit 10 thus isolates the right and left channel signals.

The muting device thus constructed removes unpleasant noise during detuning, when the received electric field intensity is low, and during reception of monaural broadcasts.

It is noted that since the output and accordingly the sub signal detection signal from the phase comparator 22 is, as described above, $\kappa_2(L-R) + A \cos Pt$, it contains a pilot signal component (5 Hz). This pilot signal component is attenuated at the output of the loop filter 23, but is not completely removed, and hence the frequency deviation detector 5 accordingly responds to the pilot signal component contained therein. Thus, the input level of the frequency deviation detector 5 fluctuates or deviates at a frequency of 5 Hz with one of the reference levels of the window comparator substantially as a center resulting in a "chattering" phenomenon in the detection output. The muting circuit 8 thus described operates in response to the chattered detected output and undesirably produces an unpleasant sound.

Figure 3:
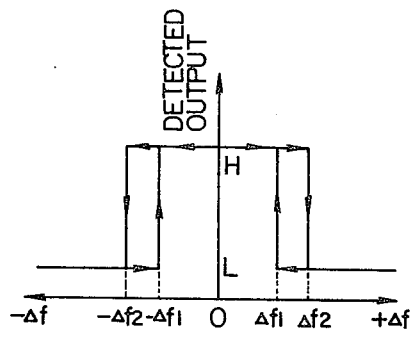
FIG. 3 is a graph showing the detecting characteristics of the frequency deviation detector in the muting circuit of the invention.

In order to eliminate the aforementioned drawback, a hysteresis characteristic is provided in the input vs. output characteristics of the window comparator forming the frequency deviation detector 5. As a result, it provides a detuned frequency detecting characteristics as shown in FIG. 3. Thus, the above chattering phenomenon is eliminated in the muting circuit and hence providing essentially distortion-free outputs.

Figure 4:
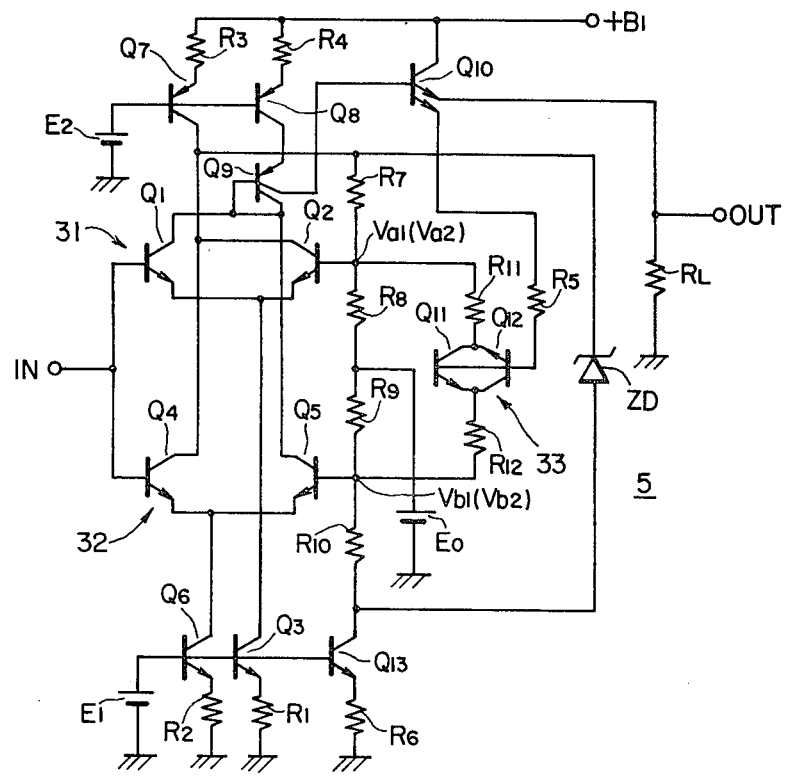
FIG. 4 is a circuit diagram of a preferred embodiment of a window comparator circuit constructed according to the present invention.

FIG. 4 is a schematic diagram of a preferred embodiment of a window comparator circuit of the invention. A first current switching circuit, hereinafter abbreviated as "CML," 31 includes a pair of NPN transistors $Q_1$ and $Q_2$ connected differentially. A current source for both the transistors $Q_1$ and $Q_2$ is composed of a NPN transistor $Q_3$ to the base of which a base bias voltage $E_1$ is applied. A resistor $R_1$ is connected between the emitter of the transistor $Q_3$ and ground. An input signal IN applied to the input terminal is applied to the base control electrode of the transistor $Q_1$. One of the transistors $Q_1$ and $Q_2$ conducts in response to the level of the input signal IN applied to the base of the transistor $Q_1$. Which of the transistor $Q_1$ and $Q_2$ which conducts determines the state of the output current of the transistor $Q_3$, the collector of which is connected to the commonly-connected emitters of the transistors $Q_1$ and $Q_2$.

A second current switching circuit 32 includes a pair of NPN transistors $Q_4$ and $Q_5$ connected differentially, similar to the transistors $Q_1$ and $Q_2$. A current source for the transistor $Q_4$ and $Q_5$ is composed of an NPN transistor $Q_6$ to the base of which a base bias voltage $E_1$ is applied and a resistor $R_2$ connected between the emitter of the transistor $Q_6$ and ground. An input IN is applied to the base of the transistor $Q_4$. One of the transistors $Q_4$ or $Q_5$ conducts in response to the level of the input signal IN applied to the base of the transistor $Q_4$. The one of the transistors $Q_4$ and $Q_5$ which conducts determines the output current of the transistor $Q_6$, the collector of which is connected to the common emitter of the transistors $Q_4$ and $Q_5$.

The outputs at the collectors of the transistors $Q_2$ and $Q_4$ are commonly connected to the collectors of current source transistors $Q_7$ and $Q_8$. A base bias $E_2$ is applied to the bases of the transistors $Q_7$ and $Q_8$. A power supply voltage $+B$ is connected through resistors $R_3$ and $R_4$ to the emitters of the transistors $Q_7$ and $Q_8$, respectively.

The outputs at the collectors of the transistors $Q_1$ and $Q_3$ are commonly connected through a diode-connected PNP transistor $Q_9$ to the collectors of the current source transistors $Q_7$ and $Q_8$. The transistor $Q_9$ is a multi-collector type. The collector not connected in the diode configuration of the transistor $Q_9$ is connected to the base control electrode of a power emitter follower transistor $Q_{10}$. The transistor $Q_{10}$ is a multi-emitter type. One emitter of the transistor $Q_{10}$ is grounded through a power resistor $R_L$. The voltage across the resistor R forms a comparison output OUT which is connected to the output terminal OUT. The other emitter of the transistor $Q_{10}$ is coupled through a resistor $R_5$ to the control input terminal of NPN transistors $Q_{11}$ and $Q_{12}$ which are connected in parallel to form a "lateral" switch 33.

There are also provided in the window comparator circuit a reference potential source $E_0$ which determines the central potential of the comparison level range of the window comparator and a zener diode AD across which is formed a predetermined potential difference $V_D$.

To the zener diode ZD is applied operating current from a current source which includes an NPN transistor $Q_{13}$ to the base of which a bias voltage $E_1$ is applied and a resistor $R_6$ connected between the emitter of the transistor $Q_{13}$ and ground. Current flows thereto from the current sources of the transistors $Q_7$ and $Q_8$ as well as the resistors $R_3$ and $R_4$, as described above.

A series circuit of resistors $R_7$ and $R_8$ is connected between the reference voltage source $E_0$ and the output cathode $R_{10}$ is connected between the reference voltage source $E_0$ and the output anode of the zener diode ZD. The resistances of the resistors $R_7$ and $R_{10}$ are equal as are the resistances of resistors $R_6$ and $R_9$. Accordingly, the reference potential $E_0$ is set at the center of the predetermined potential difference $V_D$ determined by the zener diode ZD. Also the voltages $V_a$ and $V_b$ at the connecting points of the series resistors $R_7$ and $R_8$ as well as $R_9$ and $R_{10}$ are divided to substantially equal voltages in upper and lower levels from the center of the reference potential $E_0$ as is the predetermined potential difference $V_D$. The divided voltages $V_a$ and $V_b$ are applied to the base control electrodes of the transistors $Q_2$ and $Q_3$ of the CML circuits 31 and 32, respectively, as the upper and lower reference voltages of the window comparator.

Further, a series circuit of the resistors $R_{11}$, the switch 33 and a resistor $R_{12}$ is connected in parallel with the series circuit of the resistors $R_8$ and $R_9$. The resistance values of the resistors $R_{11}$ and $R_{12}$ are made equal. Thus, the upper and lower reference voltages $V_a$ and $V_b$ can be varied together.

In this window comparator circuit, when the input signal level is equal to the reference voltage level $E_0$, the transistors $Q_1$, $Q_5$, $Q_9$ and $Q_{10}$ are cut off, and the switch 33 including the transistors $Q_{11}$ and $Q_{12}$ is also cut off. Accordingly, the output OUT is at the zero level. If the voltages $V_a$ and $V_b$ are represented by $V_{a1}$ and $V_{b1}$ at this time, the voltages $V_{a1}$ and $V_{b1}$ are as follows:

$$V_{a1} = E_0 + \frac{R_8}{R_7 + R_8} \cdot \tfrac{1}{2} V_D, \text{ and} \quad (3)$$

$$V_{b1} = E_0 + \frac{R_9}{R_9 + R_{10}} \cdot \tfrac{1}{2} V_D. \quad (4)$$

If the level of the input signal IN is raised above the reference voltage level $E_0$, the operational state of the CML circuit 31 is reversed when the level IN reaches the value $V_{a1}$ represented by the formula (3) so that the transistor $Q_1$ conducts while the transistor $Q_2$ is cut off. Accordingly, the transistors $Q_9$ and $Q_{10}$ conduct. At that time, the window comparator circuit will produces an output OUT at a high level while the switch 33 simultaneously conducts, with the result that the series circuit of the resistors $R_{11}$ and $R_{12}$ is connected in parallel with the series circuit of the resistors $R_8$ and $R_9$.

Accordingly, the upper reference voltage $V_a$ is varied to the value $V_{a2}$ represented by the following formula from the value $V_{a1}$:

$$V_{a2} = E_0 + \frac{R_8//R_{11}}{R_7 + R_8//R_{11}} \cdot \tfrac{1}{2} V_D, \quad (5)$$

where $R_8 \| R_{11}$ represents the resistance value of $R_8$ and $R_{11}$ connected in parallel. As a consequence, the comparison voltage when the input signal level is reduced from a value higher than $V_{a1}$ toward the reference voltage level $E_0$ becomes $V_{a2}$ ($>V_{a1}$), as represented by the formula (5).

When the level of the input signal IN is reduced from the reference voltage level $E_0$ toward the lower level when the output voltage is at a low level, the operational state CML circuit 32 is reversed when the level IN reaches the value $V_{b1}$ represented by the formula (4) so that the transistor $Q_5$ conducts while the transistor $Q_4$ is cut off. Accordingly, when the transistors $Q_9$ and $Q_{10}$ conducts and the output is at a high level, the switch 33 conducts simultaneously and the lower reference voltage $V_b$ will vary from $V_{b1}$ to $V_{b2}$ represented by the following formula:

$$V_{b2} = E_0 - \frac{R_9//R_{12}}{R_{10} + R_9//R_{12}} \cdot \tfrac{1}{2} V_D, \quad (6)$$

where $R_9 \| R_{12}$ represents the resistance value of $R_9$ and $R_{12}$ connected in parallel. Accordingly, the comparison voltage when the input signal level is increased from a value lower than $V_{b1}$ to the reference voltage level $E_0$ becomes $V_{b2}$ ($>V_{b1}$) represented by the formula (6).

Figure 5:
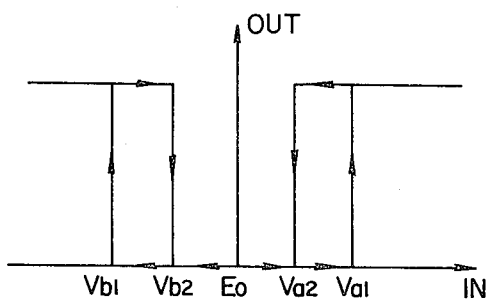
FIG. 5 is a graph showing the input vs. output characteristics of the circuit shown in FIG. 4.

FIG. 5 shows the relationship between the input signal IN and the output signal OUT of the window comparator circuit shown in FIG. 4. The upper and lower reference voltages $V_{a1}$, $V_{a2}$ and $V_{b1}$, $V_{b2}$ are the values represented by the formulas (3) to (6), and are all set at equal interval levels from the center of the reference voltage $E_0$. Thus, the circuit shown in FIG. 4 is a window comparator having an input vs. output characteristic with hysteresis. Even if the reference voltage $E_0$ varies due to variations in the circuit power supply or the like, the relationship shown in FIG. 5 is always retained. Further, it may be appreciated that the hysteresis width and inverting level and the like can be arbitrarily and accurately set by selection of the values of the respective resistors $R_7$ to $R_{12}$.

What is claimed is:

1. A muting circuit for an AM stereophonic receiver adapted for detecting a sub signal which is a difference signal between a first channel signal and a second channel signal with a phase-locked loop circuit upon reception of an AM stereophonic signal which is obtained by amplitude modulating a carrier, which is phase modulated with said sub signal, with a sum signal of said first and second channel signals, comprising: means for generating a first detection signal when the level of the AM stereophonic signal is lower than a predetermined value; means for generating a second detection signal upon detection of a non-locked state of said phase-locked loop circuit; frequency deviation detection means for generating a third detection signal when a free-running frequency of a voltage controlled oscillator in said phase-locked loop circuit and a frequency of the AM stereophonic signal are different in frequency by more than a predetermined value; means for generating a fourth detection signal when a stereo pilot signal for said AM stereophonic signal is not present; and muting means for muting a detected output signal in response to at least one of said first to fourth detection signals.

2. The muting circuit of claim 1, wherein said frequency deviation detection means comprises a window comparator for generating said third detection signal when an output level of a loop filter in said phase-locked loop circuit is out of a predetermined level range.

3. The muting circuit of claim 2, wherein an input vs. output characteristics of said window comparator includes hysteresis.

4. A muting circuit for an AM stereophonic receiver adapted for receiving a sterephonic signal composed of a carrier signal phase modulated by a sub signal and amplitude modulated by a main signal, comprising: a level detector having an input coupled to receive a IF signal produced in response to a received AM stereophonic signal; a limiter having an input coupled to receive said IF signal; an envelope detector having an input coupled to receive said IF signal; a phase-locked loop comprising a phase comparator having a first input coupled to an output of said limiter, a loop filter having an input coupled to an output of said phase comparator, a DC amplifier having an input coupled to an output of said loop filter and a voltage-controlled oscillator having an input coupled to an output of said DC amplifier and an output coupled to a second input of said phase comparator; a pilot signal level detecting circuit having an input coupled to said output of said phase comparator; a lock deviation detector having an input coupled to said output of said phase comparator; a frequency deviation detector having an input coupled to said output of said loop filter; an OR gate having inputs coupled to outputs of said level detector, said lock deviation detector, said pilot signal level detector, and said frequency deviation detector; a muting circuit having a signal input coupled to said output of said phase comparator and a muting input coupled to an output of said OR gate; and a matrix circuit having inputs coupled to outputs of said envelope detector and said muting circuit, left and right channel outputs being produced by said matrix circuit.

5. The muting circuit of claim 4 wherein said frequency deviation detector comprises a window comparator.

6. The muting circuit of claim 5 wherein said window comparator has an input vs. output characteristic including hyteresis.

7. The muting circuit of any one of claims 2, 3, 5 or 6 wherein said window comparator comprises: a reference voltage source; means for generating a predetermined potential difference around said reference voltage as a center; means for dividing said predetermined potential difference into first and second voltages being substantially equal in higher and lower levels around said reference voltage as a center; a current source; first and second current switching circuits having commonly connected outputs including a pair of transistors connected as a differential pair, said first and second voltages being respectively applied to a control electrode of a first transistor of said pair of said pair of transistors, and common input signal being applied to a control electrode of a second transistor of said pair of transistors for switching a predetermined current from said current source to said first transistor of said pair of transistors in response to the level of said common input signal; and means for varying said first and second voltages substantially in equal amounts in response to the levels of said commonly connected outputs of said first and second current switching circuits.

8. The muting circuit of any one of claims 2, 3, 5 or 6 wherein said window comparator comprises: NPN first and second transistors having emitters coupled together; an NPN third transistor having a collector coupled to said emitter of said first and second transistors; a first resistor coupled between an emitter of said third transistor and ground; a first reference voltage source coupled a base of said third transistor; NPN fourth and fifth transistors having emitters coupled together; an NPN sixth transistor having a collector coupled to said emitter of said fourth and fifth transistors and a base coupled to said reference voltage source; a second resistor coupled between an emitter of said sixth transistor and ground; a PNP seventh transistor having a base coupled to a second reference voltage source and a collector coupled to a collector of said second transistor and a collector of said fourth transistor; a third resistor coupled between an emitter of said seventh transistor and a positive power supply source voltage; a PNP eighth transistor having a base coupled to said second reference voltage source; a fourth resistor coupled between an emitter of said eighth transistor and said positive power supply source voltage; a PNP ninth transistor having first and second collectors, an emitter of said ninth transistor being coupled to a collector of said eighth transistor and a base of said ninth transistor being coupled to a collector of said first transistor, said first collector of said ninth transistor and a collector of said fifth transistor; and NPN tenth transistor having first and second emitters, a collector of said tenth transistor being coupled to said positive power supply source voltage and a base of said tenth transistor being coupled to said second collector of said ninth transistor; an NPN eleventh transistor and a PNP twelfth transistor, an emitter of said twelfth transistor being coupled to a collector of said eleventh transistor, a collector of said twelfth transistor being coupled to an emitter of said eleventh transistor and bases of said eleventh and twelfth transistors being coupled together; a fifth resistor coupled between said bases of said eleventh and twelfth transistors and said second emitter of said tenth transistor; a thirteenth NPN transistor having a base coupled to said first reference voltage source; a sixth resistor coupled between an emitter of said thirteenth transistor and ground; a zener diode having an anode coupled to a collector of said thirteenth transistor and a cathode coupled to said collector of said seventh transistor; a seventh resistor coupled between said collector of said seventh transistor and a base of said second transistor; an eighth resistor coupled between said base of said second transistor and a third reference voltage source; a ninth resistor coupled between said third reference voltage source and a base of said fifth transistor; a tenth resistor coupled between said base of said fifth transistor and said collector of said thirteenth transistor; an eleventh resistor coupled between said base of said second transistor and said emitter of said twelfth transistor; a twelfth resistor coupled between said collector of said twelfth transistor and said base of said fifth transistor; an output load resistor coupled between said second collector of said tenth transistor and ground, an output signal being formed across said output load resistor, an input signal being coupled to bases of said first and fourth transistors, resistances of said seventh and tenth resistors being equal, resistance values of said sixth and ninth resistors being equal and resistance values of said eleventh and twelfth resistors being equal.

* * * * *